(12) United States Patent
Lin

(10) Patent No.: US 7,833,021 B2
(45) Date of Patent: Nov. 16, 2010

(54) BURN-IN SOCKET WITH ADAPTER FOR LOADING IC PACKAGE

(75) Inventor: Wei-Chih Lin, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/489,457

(22) Filed: Jun. 23, 2009

(65) Prior Publication Data

US 2009/0317988 A1 Dec. 24, 2009

(30) Foreign Application Priority Data

Jun. 23, 2008 (TW) .............................. 97211085 U

(51) Int. Cl.
*H01R 12/00* (2006.01)
*H05K 1/00* (2006.01)
(52) U.S. Cl. .......................... 439/68; 439/331; 439/526
(58) Field of Classification Search .................. 439/68, 439/525, 526, 264, 70, 331, 73
See application file for complete search history.

(56) References Cited

U.S. PATENT DOCUMENTS

| 7,335,030 | B2* | 2/2008 | Kunioka et al. | 439/73 |
|---|---|---|---|---|
| 7,462,057 | B2* | 12/2008 | Hsu | 439/331 |
| 7,666,029 | B2* | 2/2010 | Lin | 439/526 |
| 2007/0238327 | A1* | 10/2007 | Hsu | 439/70 |
| 2008/0076272 | A1* | 3/2008 | Hsu | 439/55 |
| 2009/0253276 | A1* | 10/2009 | Lin | 439/68 |

\* cited by examiner

*Primary Examiner*—Hae Moon Hyeon
(74) *Attorney, Agent, or Firm*—Andrew C. Cheng; Wei Te Chung; Ming Chieh Chang

(57) ABSTRACT

A burn-in socket for receiving an integral circuit (IC) package comprises a base defining a cavity for receiving the IC package and an adapter retained in the cavity. The adapter has two-pieces configuration and comprises a loading board for loading the IC package and a positioning board assembled upon the bottom plate of the loading board for positioning the IC package.

20 Claims, 5 Drawing Sheets

BURN-IN SOCKET WITH ADAPTER FOR LOADING IC PACKAGE

FIELD OF THE INVENTION

The present invention relates to a burn-in socket, and more particularly to a burn-in socket with an adapter, which has a loading board for loading an integral circuit (IC) package and a positioning board mounted upon the loading board for positioning the IC package.

DESCRIPTION OF RELATED ART

IC packages are miniaturized electronic devices, in which a number of active and passive circuit elements are located on or within a continuous body of material to perform the function of a complete circuit. To ensure the functionality and reliability during its service life, the IC package must be conducted with a burn-in test before actual field application. The IC package in the burn-in test usually undergoes an extended period of time at a high temperature, so that any earlier failure of the IC package can be detected accordingly. A so-called burn-in socket is provided, in which the electronic packages are placed in an oven and operated for a time at an elevated temperature, e.g., 140 degrees C., and under a voltage source that is greater than the rated value; those IC packages that continue to perform satisfactorily and functionally are then approved for shipment.

A typically burn-in socket usually has a base with a plurality of contacts therein and a cover mounted on the base and being movable relative to the base. The base has a rectangular configuration, and defines a receiving cavity for the IC package and a plurality of contact passageways on the bottom of the receiving cavity for receiving the contacts. The base is assembled with a locking portion and a pivoting portion for pivotally mounting the cover on the base, on two sides thereof respectively; the cover is assembled with a latching portion engaging with the locking portion disposed on the base to latch the cover on the base. The base of above typically burn-in socket is integrally made by inserting molding by using a mold, in fact, it is a simple process. However, there are variable IC packages, and each has a different dimension, correspondingly, different burn-in sockets are needed for different electronic packages. To reduce a producing time and accelerate developing speed, people usually modify the mold used for a previous burn-in socket and then make another suitable burn-in socket by the mold again. However, it still cost a lot of money and time to modify the mold.

Hence, an improved burn-in socket is required to overcome the above-mentioned disadvantages of the related art.

SUMMARY OF THE INVENTION

Accordingly, an object of the present invention is to provide a burn-in socket with an adapter, which has a loading board for loading an integral circuit (IC) package and a positioning board mounted upon the loading board for positioning the IC package.

To achieve the aforementioned objects, a burn-in socket for receiving an IC package comprises a base defining a cavity for receiving the IC package and an adapter retained in the cavity. The adapter has a loading board and a positioning board, the loading board has a bottom plate for loading the IC package, the positioning board is detachably assembled upon the bottom plate of the loading board and defines an opening for positioning the IC package.

Other objects, advantages and novel features of the invention will become more apparent from the following detailed description of a preferred embodiment when taken in conjunction with the accompanying drawings.

DETAILED DESCRIPTION OF THE INVENTION

Reference will now be made to the drawings to describe the present invention in detail.

Figure 1:
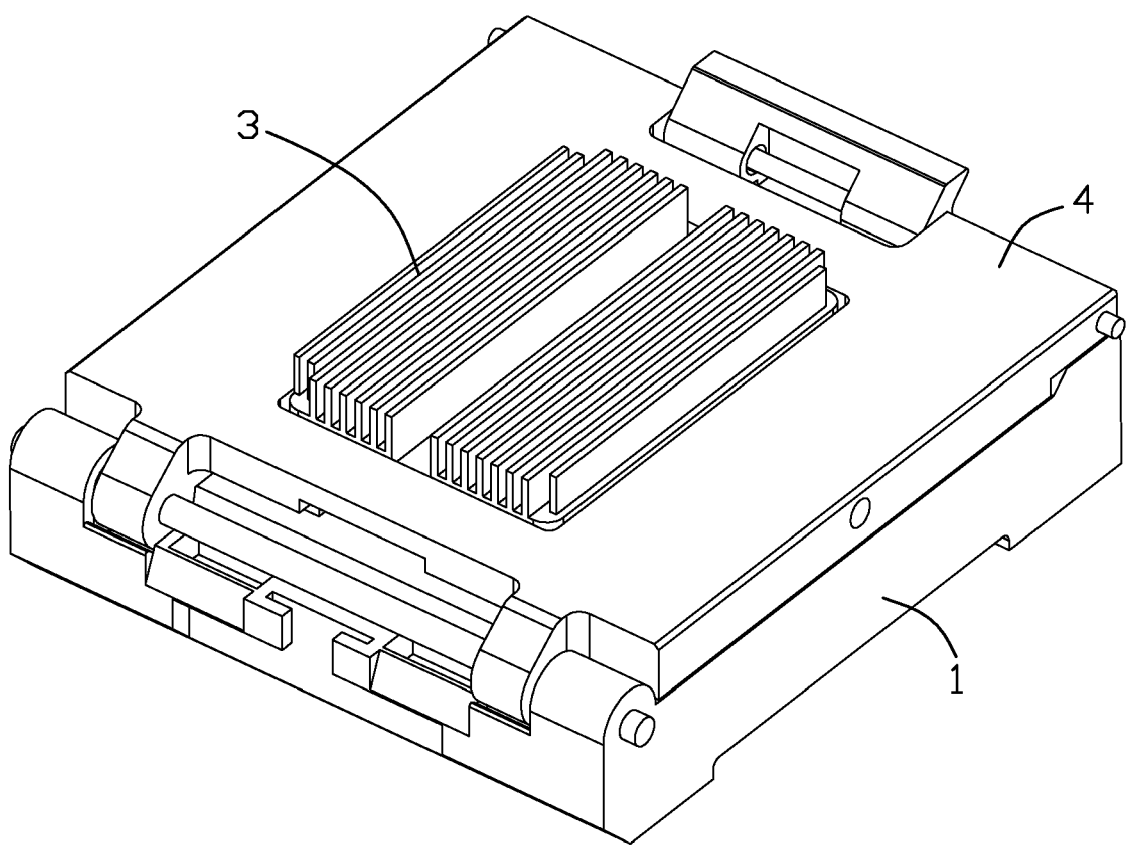
FIG. 1 is an assembled, perspective view of a burn-in socket in accordance with the present invention.
Figure 2:
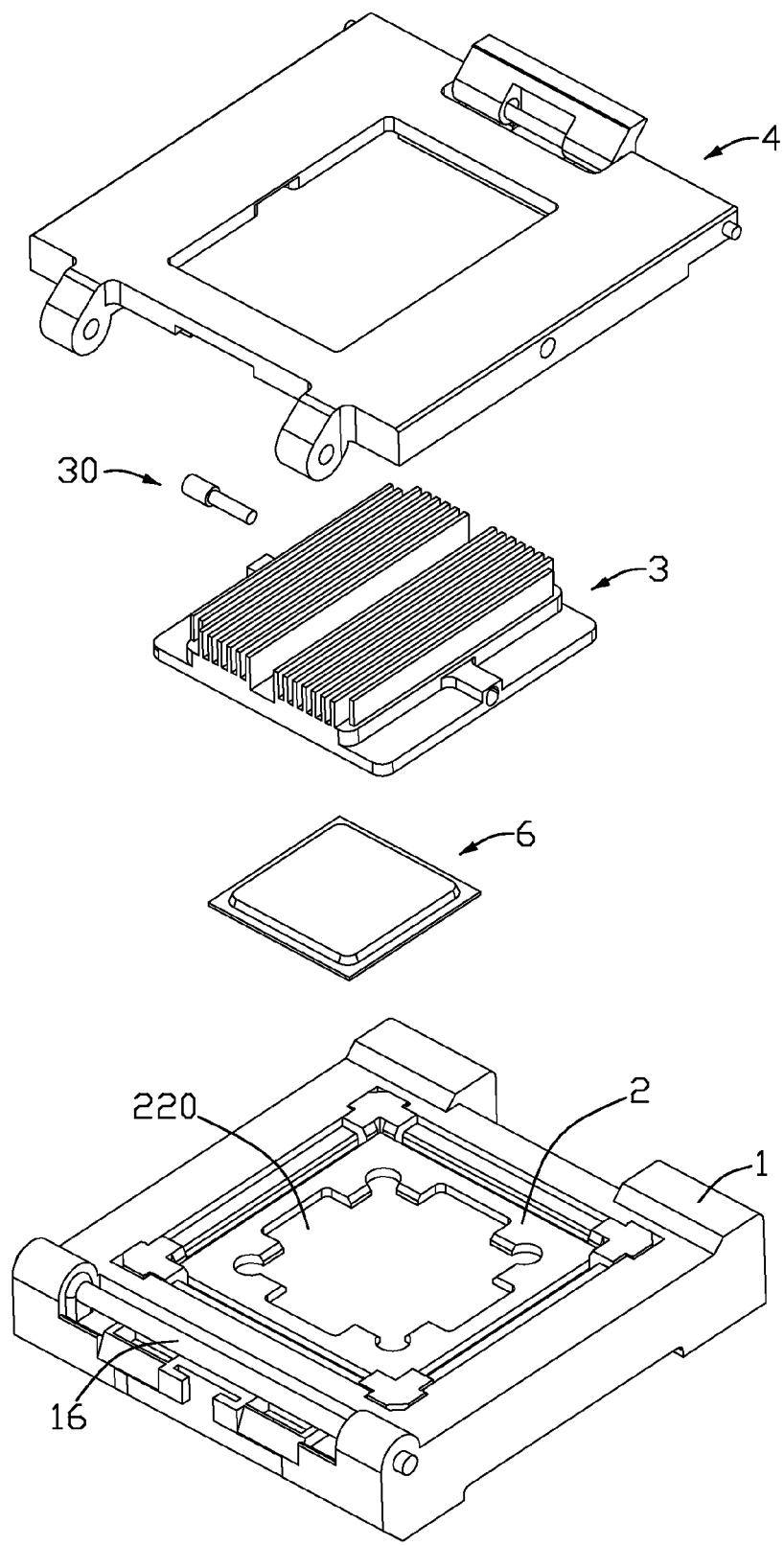
FIG. 2 is a partially exploded, perspective view of the burn-in socket in accordance with the present invention.
Figure 3:
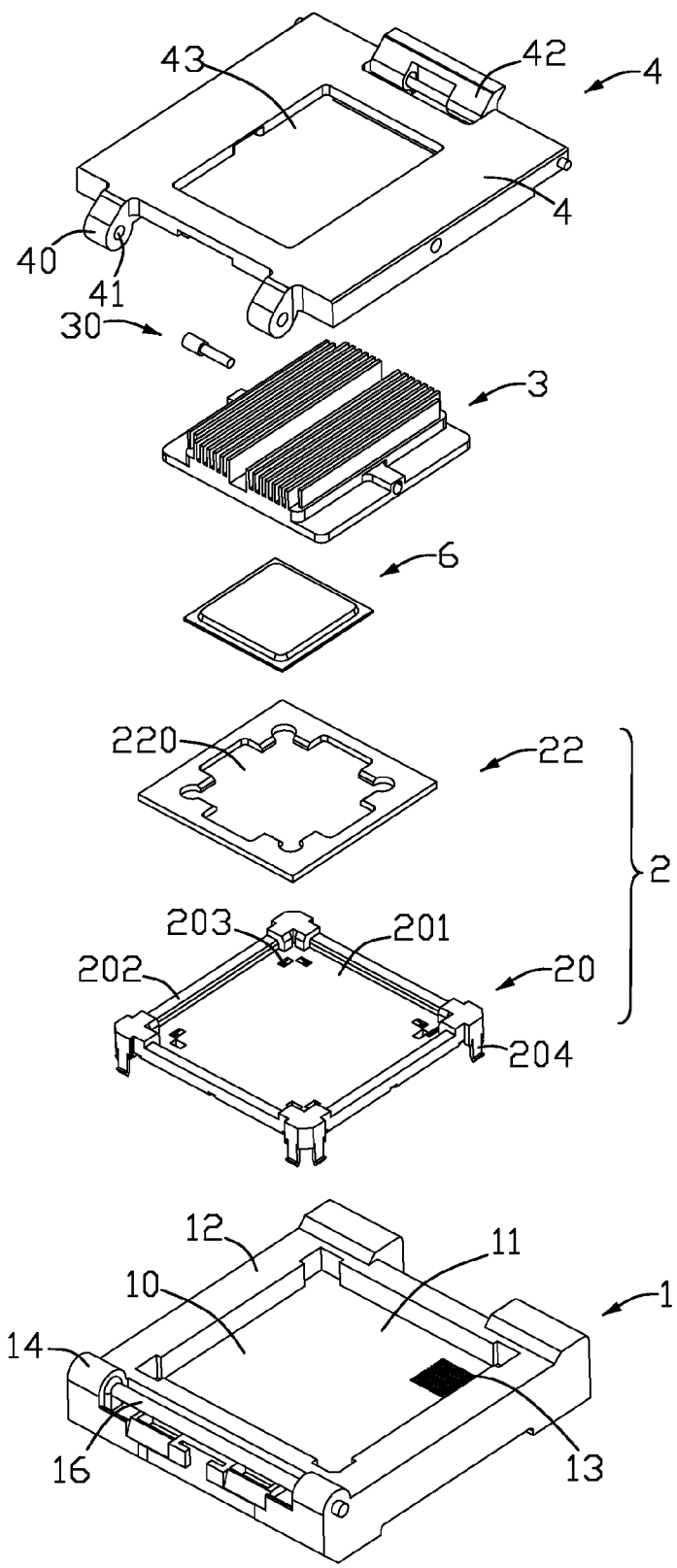
FIG. 3 is an exploded, perspective view of the burn-in socket in accordance with the present invention.
Figure 4:
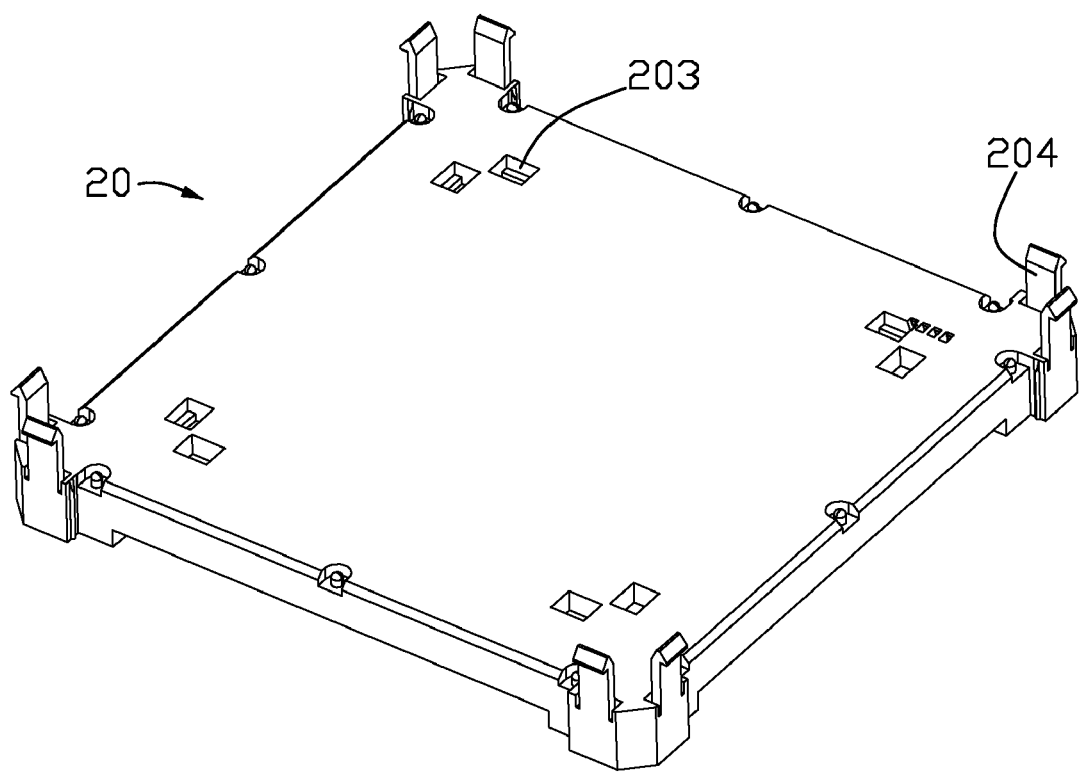
FIG. 4 is an exploded, perspective view of an adapter of the burn-in socket in accordance with the present invention, taken from a bottom side.
Figure 4:
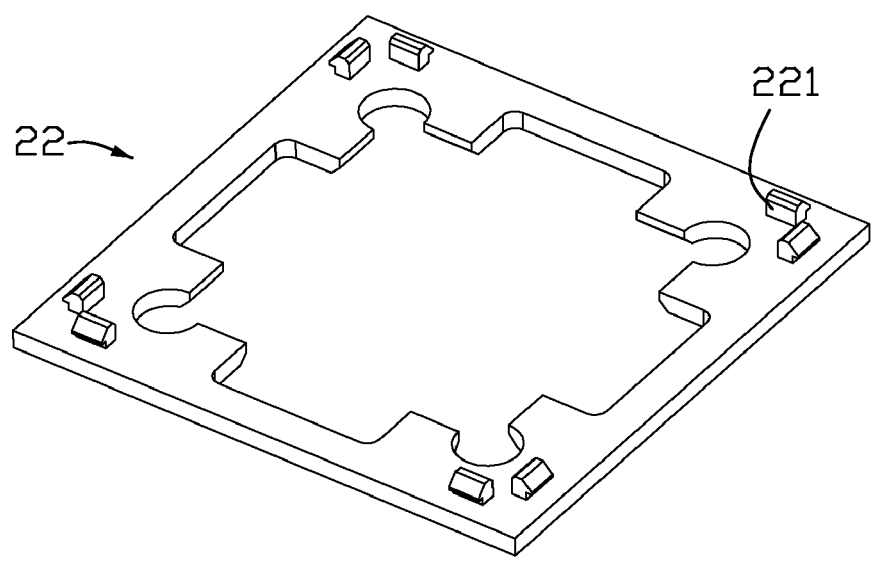

Referring to FIGS. 1-2, a burn-in socket in accordance to a preferred embodiment of present invention mounted on a testing printed circuit board (not shown) for receiving an integral circuit (IC) package 6 comprises a base 1, an adapter 2 received in the base 1, a heat sink 3 and a cover 4 pivotally assembled to the base 1.

Referring to FIG. 2 to FIG. 5, the base 1 has a rectangular configuration and is formed with a bottom wall 11 and a plurality of sidewalls 12 disposed on a periphery of the bottom wall 11, the bottom wall 11 and the sidewall 12 corporately defines a rectangular cavity 10 for receiving the IC package 6. The bottom wall 11 is located under the cavity 10 and defines a plurality of contact passageways 13 for receiving a plurality of contacts (not shown). The base 1 is provided with two clumps 14 on two opposite sides of an end thereof, and a pivot hole (not labeled) is defined on an inner side surface of the clump 14 for a pin shaft 16 passing therethough.

The cover 4 is integrally made from metallic material and has two engaging portions 40 on two opposite sides of an end thereof, each engaging portion 40 has a shaft hole 41 for the pin shaft 16 passing through to pivot the cover 4 to the base 1. The cover 4 has a locking member 42 arranged on an opposite end thereof, which locks the cover 4 on the base 1 to remain in a close state. The heat sink 3 is retained to the cover 4 by a linking shaft 30 and rotates with the cover 4 relative to the base 1. The cover 4 further defines a mouth 43 for the heat sink 3 passing through.

The adapter 2 is received on the bottom of the cavity 10 of the base 1 and comprises a loading board 20 and a positioning board 22 assembled upon the loading board 20. The loading board 20 is formed with a bottom plate 201 for loading the IC package 6 and a plurality of rims 202 located around the bottom plate 201 and protruding upwardly. The bottom plate 201 defines a plurality of contact grooves (not shown) corresponding to the contact passageways 13 of the base 1. The bottom plate 201 further has a plurality of slots 203 on four corners thereof. The loading board 20 has a plurality of latching arms 204 extending downwardly from outside of four corners thereof to retain the loading board 20 in the base 1.

The positioning board 22 has a piece-like shape and defines an opening 220 on a center thereof to position the IC package 6. The positioning board 22 has a plurality of clasps 221 extending downwardly from a bottom surface thereof to engage with the slots 203 to retain the positioning board 22 upon the bottom plate 201 of the loading board 20, the rims 202 of the loading board 20 position the positioning board 22.

Figure 5:
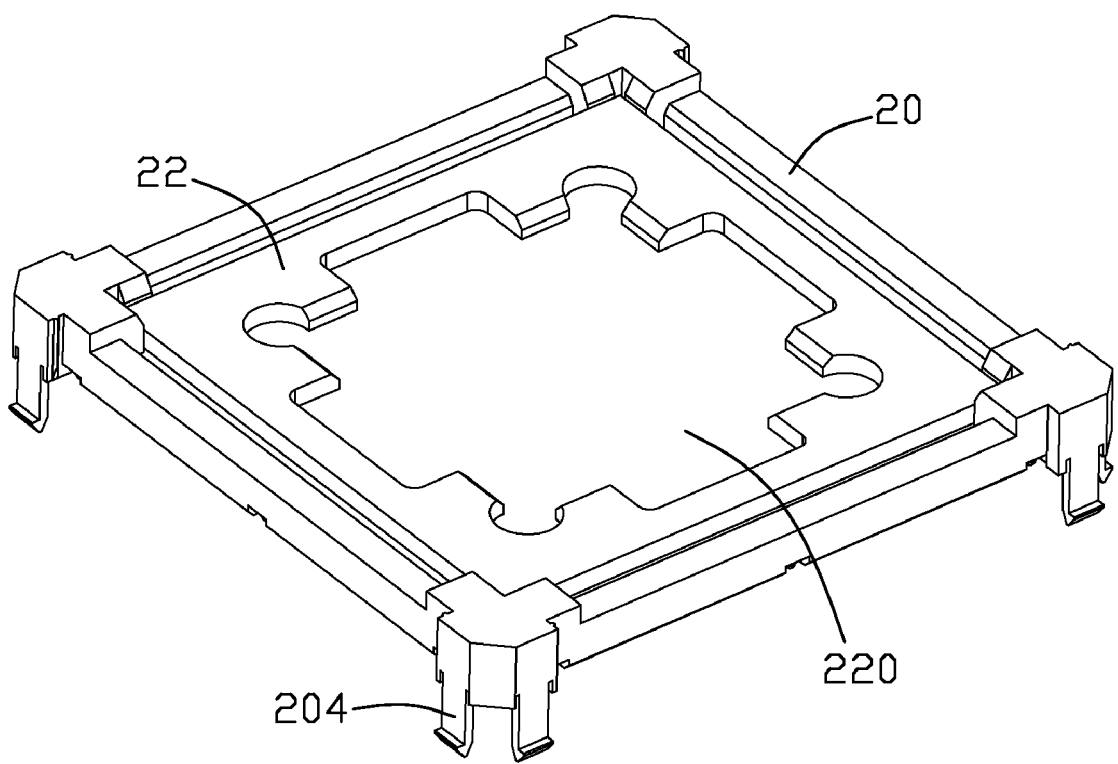
FIG. 5 is an assembled, perspective view of the adapter of the burn-in socket in accordance with the present invention.

Referring to FIG. 2 and FIG. 5, when assembling, the contact (not shown) are pre-assembled in the base 1; and then the positioning board 22 is retained on the loading board 20; then the assembled adapter 2 is put in the cavity 10 of the base 1; after the heat sink 3 is assembled on the cover 4 by the linking shaft 30, the cover 4 is pivotally assembled to the base 1 by the pin shaft 16, so the burn-in socket is completely assembled. The IC package 6 is received in the cavity 10 and put on the adapter 2 when the cover 4 is in an opened position; then the cover 4 is rotated to a closed position and locked on the close position by the locking member 42 engaging with the base.

The adapter 2 of the burn-in socket of present invention is two-pieces configuration, so people only need to change the positioning board 22 of the adapter 2 to suit another IC package (not shown) with a different size, so the burn-in socket can be repeatedly used, thereby producing cost is reduced and efficiency is improved.

However, the disclosure is illustrative only, changes may be made in detail, especially in matter of shape, size, and arrangement of parts within the principles of the invention.

What is claimed is:

1. A burn-in socket for receiving an integral circuit (IC) package, comprising:
   a base defining a cavity for receiving the IC package; and
   an adapter retained in the cavity and having a loading board and a positioning board, the loading board having a bottom plate for loading the IC package, the positioning board detachably assembled to and upon the bottom plate of the loading board and defining an opening for positioning the IC package.

2. The burn-in socket as claimed in claim 1, wherein the bottom plate of the loading board defines a plurality of slots, the positioning board is provided with a plurality of clasps on a bottom surface thereof to engage with the slots of the loading board to mount the positioning board on the bottom plate of the loading board.

3. The burn-in socket as claimed in claim 2, wherein the loading board has a plurality of latching arms extending downwardly to retain the loading board on a bottom of the cavity of the base.

4. The burn-in socket as claimed in claim 3, wherein the loading board has a plurality of rims around the bottom plate, the positioning board is positioned by the rims.

5. The burn-in socket as claimed in claim 4, further comprising a cover, an end of the cover is pivotally assembled to the base, and an opposite end of the cover is pivotally assembled with a locking member to lock the cover to the base.

6. The burn-in socket as claimed in claim 5, further comprising a heat sink mounded on the cover.

7. The burn-in socket as claimed in claim 1, wherein the positioning board can be changed with another suitable positioning board for another IC package which has a different size with the IC package.

8. A burn-in socket comprising:
   a base defining a plurality of contact passageways;
   a loading board discrete from but attached upon the base, said loading board defining a plurality of contact grooves in vertical alignment with the corresponding contact passageways, respectively;
   a positioning board discrete from but detachably attached to and upon the loading board, said positioning board including a center opening defined by a predetermined periphery to compliantly confinedly receive a corresponding integral circuit (IC) package in the center opening under condition that said IC package is directly seated upon the loading board and corresponding conductors of the IC package are mechanically and electrically engaged with corresponding contacts, respectively.

9. The burn-in socket as claimed in claim 8, wherein said base defines a cavity in which said loading board and said positioning board and the IC package are disposed.

10. The burn-in socket as claimed in claim 9, further including a cover pivotally mounted to one end of the base.

11. The burn-in socket as claimed in claim 10, wherein said cover defines a mouth through which a heat sink extends, and said heat sink is seated upon the IC package.

12. The burn-in socket as claimed in claim 8, wherein said positioning board is unitarily formed as one piece.

13. The burn-in socket as claimed in claim 8, wherein the loading board defines a plurality of rims to form a boundary to confine said positioning board therein.

14. The burn-in socket as claimed in claim 8, wherein said loading board is unitarily formed as one piece.

15. The burn-in socket as claimed in claim 8, wherein said loading board is detachable with regard to the base.

16. The burn-in socket as claimed in claim 8, wherein the positioning board includes a plurality of downwardly extending clasps latched to corresponding slots in the loading board.

17. A burn-in socket for receiving an integral circuit (IC) package, comprising:
    a base defining a cavity for receiving the IC package;
    a plurality of contacts disposed in the base for mechanical and electrical engagement with corresponding conductors of the IC package;
    a detachable adapter discrete from the base but retained in the cavity and having a bottom plate for loading the IC package, a positioning board attached to and located upon the bottom plate and defining an opening for circumferentially positioning the IC package; wherein
    said bottom plate defines a plurality of contact grooves in vertical alignment with the corresponding contacts, respectively.

18. The burn-in socket as claimed in claim 17, wherein said bottom plate is formed on a loading board which attaches the adaptor to the base.

19. The burn-in socket as claimed in claim 18, wherein said loading board defines a plurality of rims to circumferentially confine the positioning board therein.

20. The burn-in socket as claimed in claim 17, wherein the positioning board includes a plurality of downwardly extending clasps latched to corresponding slots in the bottom plate.

\* \* \* \* \*